US011887510B2

United States Patent
Suga et al.

(10) Patent No.: US 11,887,510 B2
(45) Date of Patent: Jan. 30, 2024

(54) ROLLABLE ELECTRONIC APPARATUS

(71) Applicant: SHARP KABUSHIKI KAISHA, Sakai (JP)

(72) Inventors: Katsuyuki Suga, Sakai (JP); Yuki Yasuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 497 days.

(21) Appl. No.: 17/279,535

(22) PCT Filed: Sep. 28, 2018

(86) PCT No.: PCT/JP2018/036498
§ 371 (c)(1),
(2) Date: Mar. 24, 2021

(87) PCT Pub. No.: WO2020/065988
PCT Pub. Date: Apr. 2, 2020

(65) Prior Publication Data
US 2021/0343194 A1 Nov. 4, 2021

(51) Int. Cl.
G09F 9/30 (2006.01)
H10K 77/10 (2023.01)

(52) U.S. Cl.
CPC ............ *G09F 9/301* (2013.01); *H10K 77/111* (2023.02)

(58) Field of Classification Search
CPC combination set(s) only.
See application file for complete search history.

(56) References Cited

U.S. PATENT DOCUMENTS

| 9,098,241 | B1* | 8/2015 | Cho | B65H 75/28 |
| 9,788,440 | B2* | 10/2017 | Cho | H05K 1/147 |
| 10,254,797 | B2* | 4/2019 | Lee | H10K 50/84 |
| 10,671,124 | B2* | 6/2020 | Kim | H05K 5/0017 |
| 10,701,813 | B2* | 6/2020 | Kim | G06F 1/1652 |
| 11,087,648 | B2* | 8/2021 | Lee | G06F 1/1652 |
| 11,395,422 | B2* | 7/2022 | Suga | G09F 9/30 |
| 2016/0029474 | A1* | 1/2016 | Cho | B65H 75/28 |
| | | | | 361/749 |
| 2016/0161983 | A1* | 6/2016 | Lee | G09F 9/301 |
| | | | | 361/749 |
| 2017/0031388 | A1* | 2/2017 | Han | G06F 1/1601 |
| 2017/0071066 | A1* | 3/2017 | Cho | H05K 5/0217 |

(Continued)

FOREIGN PATENT DOCUMENTS

JP 2016-024460 A 2/2016
JP 2017-227863 A 12/2017

*Primary Examiner* — Lisa Lea-Edmonds
(74) *Attorney, Agent, or Firm* — ScienBiziP, P.C.

(57) ABSTRACT

A rollable electronic apparatus being windable, includes: a flexible electronic device; a flexible cable; a circuit substrate; and a support body having a tubular body, wherein the flexible electronic device includes a terminal portion, the flexible cable connects the terminal portion and the circuit substrate, a drive circuit is mounted on the circuit substrate, the flexible electronic device and the flexible cable are wound on an outer circumferential surface of the support body by rotating the support body, the support body has, in a cross-sectional view, two curved portions and a planar portion connecting the two curved portions, and the circuit substrate is stored in the planar portion in a state in which the flexible cable is wound.

18 Claims, 11 Drawing Sheets

(56) References Cited

U.S. PATENT DOCUMENTS

2017/0196103 A1* 7/2017 Cho .................... H04M 1/0268
2017/0367198 A1  12/2017 Park et al.
2019/0204874 A1* 7/2019 Kim ..................... G06F 1/1643

* cited by examiner

ROLLABLE ELECTRONIC APPARATUS

TECHNICAL FIELD

The disclosure relates to a rollable electronic apparatus.

BACKGROUND ART

A rollable electronic apparatus having a portion to be wound and stored is known. Examples of the rollable electronic apparatus include an X-ray sensor, a pressure sensor, and a display apparatus. As the display apparatus, a display apparatus using a flexible display element, such as a display apparatus provided with an organic light emitting diode (OLED) as a display element, has been put to practical use. As an example of the display apparatus using a flexible display element, there is conceivable a rollable display apparatus in which a display element is wound around a columnar support body for compact storage.

PTLs 1 and 2 each describe a roller mechanism and the like in the rollable display apparatus.

CITATION LIST

Patent Literature

PTL 1: JP 2016-24460 A
PTL 2: US 2017/0031388 A1

SUMMARY

Technical Problem

In the display apparatus, typically, a circuit substrate on which an LSI or the like for inputting a display signal and controlling display is mounted has to be connected to at least one side of a display element. Due to this, in a rollable display apparatus, it is important how to place this portion in a housing or a roller mechanism.

As a possible configuration, for example, a circuit substrate is stored in a support body having a tubular shape, the circuit substrate and a display element are connected via a slit formed in the support body, and the support body is rotated to wind the display element around the support body for storage.

However, it is not easy to precisely form the slit in the support body having a tubular shape and being hollow. In addition, it is not easy to place the circuit substrate in the tubular shape via the slit, and it is highly likely that the display element or a cable is damaged during assembly.

Furthermore, also in other rollable electronic apparatuses, a portion to be wound and stored may be damaged during assembly or the like.

Accordingly, an object of the disclosure is to provide a rollable electronic apparatus that is easy to assemble and that is less likely to damage a portion to be wound and stored, such as a flexible display panel.

Solution to Problem

In order to solve the above problem, a rollable electronic apparatus of the disclosure, the rollable electronic apparatus being windable, includes:
a flexible electronic device; a flexible cable; a circuit substrate; and a support body having a tubular shape, the flexible electronic device includes a terminal portion, the flexible cable connects the terminal portion and the circuit substrate,
a drive circuit is mounted on the circuit substrate,
the flexible electronic device and the flexible cable are wound on an outer circumferential surface of the support body by rotating the support body,
the support body has, in a cross-sectional view, two curved portions and a planar portion connecting the two curved portions, and
the circuit substrate is stored in the planar portion in a state in which the flexible cable is wound.

Advantageous Effects of Disclosure

According to the disclosure, it is possible to provide a rollable electronic apparatus that is easy to assemble and that is less likely to damage a portion to be wound and stored, such as a flexible display panel.

DESCRIPTION OF EMBODIMENTS

Embodiments of a rollable electronic apparatus are described below using, as an example, a rollable display apparatus in which a portion to be provided in a rollable electronic apparatus, wound, and stored (flexible electronic device) is a flexible display panel. Note that examples of flexible electronic devices other than the flexible display panel include various electronic components that can be wound, such as an X-ray sensor or a pressure sensor.

Known Example

Overview of Rollable Display Apparatus

Before describing embodiments of the disclosure, an overview of a rollable display apparatus 110 will be described based on a known example.

Figure 1:
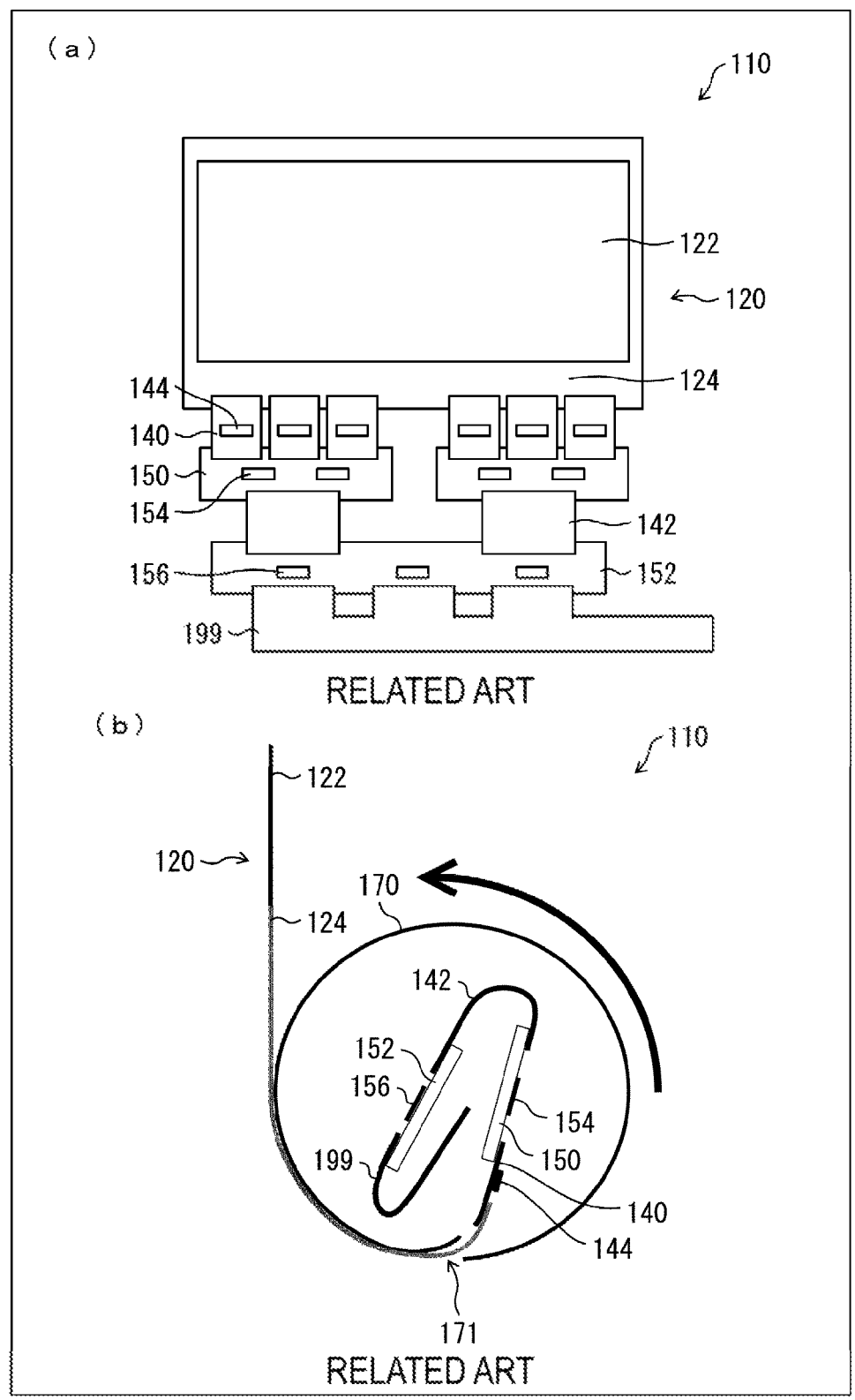
FIG. 1 includes views illustrating a rollable display apparatus of a known example, where (a) illustrates an entirety of the rollable display apparatus, and (b) illustrates a side view of a support body.

FIG. 1 are views illustrating the rollable display apparatus 110 of the known example, where (a) of FIG. 1 illustrates an entirety of the rollable display apparatus 110, and (b) of FIG. 1 illustrates a side view of a support body 170.

As illustrated in (a) of FIG. 1, the rollable display apparatus 110 includes a flexible display panel 120 and circuit substrates 150, 152. The flexible display panel 120 includes a display region 122 that performs display, and a wiring line region 124 to which an external wiring line is connected. The wiring line region 124 corresponds to a frame region that is a region around the display region 122.

The circuit substrate 150 and the like are connected to the wiring line region 124 via a flexible cable 140. In the example illustrated in (a) of FIG. 1, the circuit substrates are arranged in two stages (the circuit substrate 150 and the circuit substrate 152), and the circuit substrate 150 and the circuit substrate 152 are arranged in this order from the side closer to the flexible display panel 120. These are connected via flexible cables, and the flexible display panel 120 and the circuit substrate 150 are connected via the flexible cable 140, and the circuit substrate 150 and the circuit substrate 152 are connected by a flexible cable 142 for relay.

A drive circuit (also referred to as a control circuit) is provided on each of the circuit substrates 150, 152, and a drive circuit 154 is provided on the circuit substrate 150, and another drive circuit 156 is provided on the circuit substrate 152.

In addition, a driver circuit 144 is provided on the flexible cable 140.

Furthermore, an external connection cable 199 is connected to the circuit substrate 152, so that a signal or the like from the outside can be input to the circuit substrate 152 and the like.

Here, the circuit substrate 150 refers to a rigid substrate, and the drive circuit 156 refers to a component such as an IC chip provided on the circuit substrate 150. Furthermore, the driver circuit 144 refers to a component such as an IC chip provided on the flexible cable 140. The same applies to subsequent description. Furthermore, these names and functions are appropriately changed depending on a type of flexible electronic device provided in the rollable electronic apparatus.

Winding (1) on Support Body

Next, winding of the flexible display panel 120 on the support body 170 will be described with reference to (b) of FIG. 1.

The support body 170 is a hollow tubular body having a circular cross-sectional shape, and has a slit 171 that provides communication between the inside and the outside of the support body 170.

In the flexible display panel 120 and the support body 170, the circuit substrates 150, 152, which are each a plate-like member, are built in the support body 170 via the slit 171. Specifically, a portion beyond the flexible cable 140, that is, a portion positioned in a direction away from the flexible display panel 120, is built in the support body 170. As a result, a portion such as the circuit substrate 150 that has a plate-like shape and is unsuitable for winding does not need to be wound by rotation of the support body 170 (an arrow in (b) of FIG. 1), and only the flexible display panel 120 having flexibility can be wound by the support body 170.

Winding (2) on Support Body

How to wind the flexible display panel 120 is the same even when the circuit substrate 150 is arranged in one stage rather than in two stages.

Figure 2:
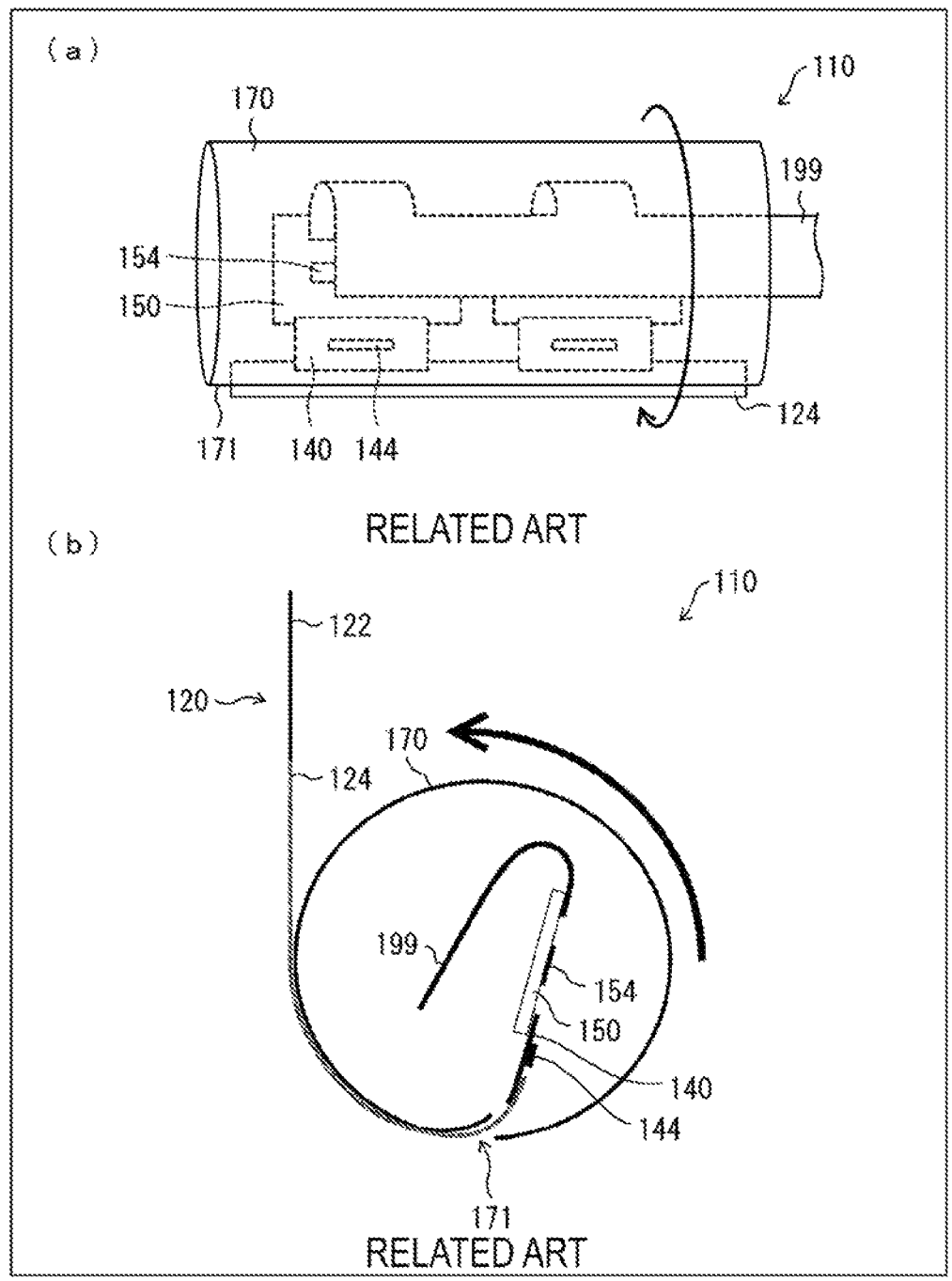
FIG. 2 includes views illustrating a rollable display apparatus of the known example, where (a) illustrates a front view of a support body, and (b) illustrates a side view of the support body.

This will be described with reference to (a) of FIG. 2 and (b) of FIG. 2. FIG. 2 includes views illustrating a rollable display apparatus 110 of a known example, where (a) of FIG. 2 illustrates a front view of a support body 170, and (b) of FIG. 2 illustrates a side view of the support body 170.

As illustrated in (b) of FIG. 2, in this example, a flexible display panel 120 is not provided with another circuit substrate 152, and only a circuit substrate 150 is provided. Thus, only one circuit substrate 150 is built in the support body 170.

Next, the flexible display panel 120 having a single circuit substrate and a few components will be used as an example to describe arrangement and the like inside the support body 170 with reference to (a) of FIG. 2.

As illustrated in (a) of FIG. 2, inside the support body 170, a portion, which includes a part of a wiring line region 124 of the flexible display panel 120 and is beyond the part of the wiring line region 124, is disposed to be folded along an inner circumference of the support body 170, via a slit 171.

This allows only a flexible portion of the rollable display apparatus 110, i.e., only a portion of the flexible display panel 120, to be wound.

In addition, an external connection cable 199 is drawn from a side surface of the support body 170, and can connect the circuit substrate 150 and the like to external devices and the like.

Problem of Known Example

The known example described above has problems.

For example, in the known example, the circuit substrate 150 and the like need to be built in the support body 170 via the slit 171. It is not easy to insert the circuit substrate 150 and the like to the inside of the support body 170, which causes the flexible display panel 120 or the flexible cable 140 to be damaged when assembling the rollable display apparatus 110. This is noticeable especially for a large rollable display apparatus.

Example 1

Overview of Rollable Display Apparatus

Hereinafter, Example 1 of the disclosure will be described with reference to FIG. 3 and the like. Note that, in the following description, portions similar to those of the known example are given the same names, and the description thereof will be omitted or simplified.

Figure 3:
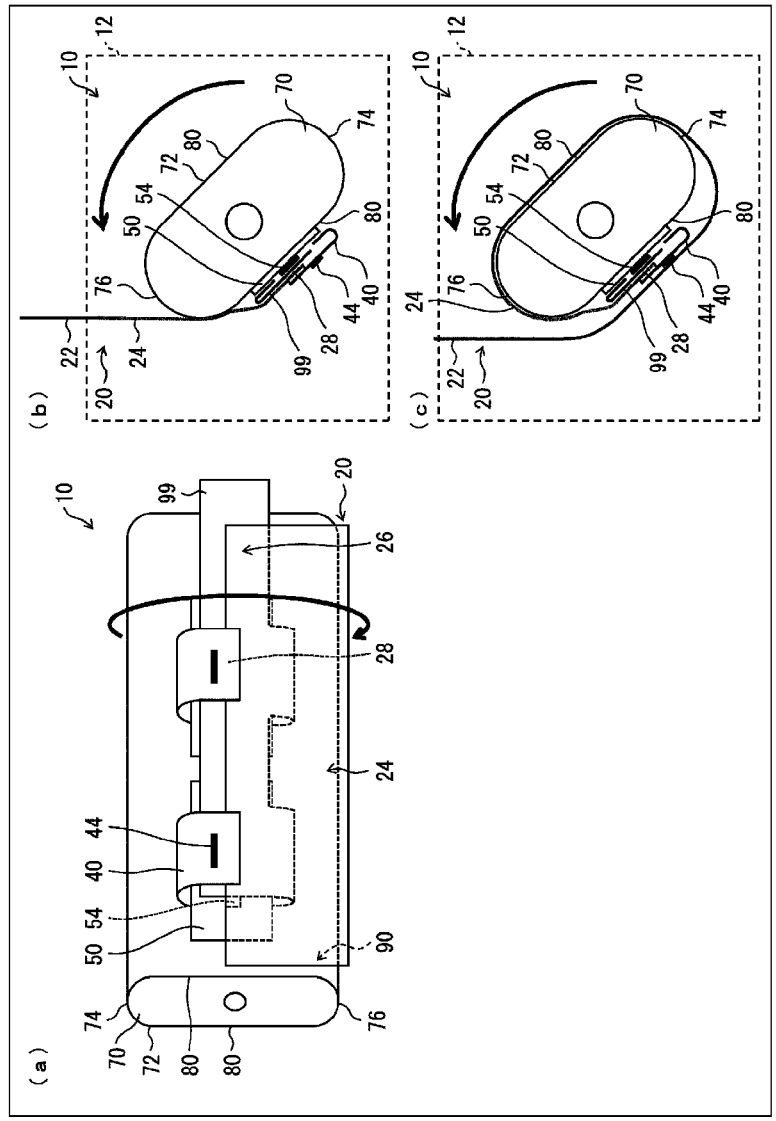
FIG. 3 includes views illustrating a rollable display apparatus of Example 1, where (a) illustrates a front view of a support body, (b) illustrates a side view of the support body before winding rotation, and (c) illustrates a side view of the support body after starting winding rotation.

FIG. 3 includes views illustrating a rollable display apparatus 10 of Example 1. As illustrated in FIG. 3, Example 1 is characterized in that a support body 70 having a tubular shape has an elliptical columnar shape rather than a cylindrical shape, and has planar portions 80 on an outer circumferential surface 72 of the support body 70, on which a circuit substrate 50 and the like can be mounted. Hereinafter, the configuration will be described sequentially.

(a) of FIG. 3 is a front view of the support body 70. As illustrated in (a) of FIG. 3, the support body 70 of Example 1 has an elliptical cross-sectional shape, unlike the support body 170 of the known example having a circular cross-sectional shape illustrated in (a) of FIG. 2. In addition, the elliptical shape is constituted generally by two curved portions 74, 76 and the planar portions 80 connecting the curved portions 74, 76. In other words, the curved portions 74, 76 and the planar portions 80 constitute at least a part of the elliptical shape.

In Example 1, the circuit substrate 50 is disposed on one of the planar portions 80 to be stored. In other words, in the known example, the slit 171 is formed in the support body 170, and the circuit substrate 150 is disposed in the support body 170 via the slit 171. In contrast, in Example 1, the circuit substrate 50 is disposed not in the support body 70 but on one of the planar portions 80 of the outer circumferential surface 72 of the support body 70.

In addition to this, a flexible cable 40 and an external connection cable 99 connected to the circuit substrate 50 are also disposed outside the support body 70. Specifically, the flexible cable 40 and the external connection cable 99 are folded and disposed on the planar portion 80 on which the circuit substrate 50 is disposed. The flexible cable 40 and a flexible display panel 20 are connected via a terminal portion 28 in a wiring line region 24 of the flexible display panel 20. Note that the wiring line region 24 corresponds to a frame region of the flexible display panel 20 and the terminal portion 28 is provided at an end 26 of the flexible display panel 20.

Furthermore, similarly to the known example, the circuit substrate 50 is provided with a drive circuit 54, and the flexible cable 40 is provided with a driver circuit 44. Hereinafter, (a) of FIG. 3 will be described with reference to (b) of FIG. 3 in which the support body 70 is viewed from the side.

In Drawing Flexible Display Panel (b) of FIG. 3 is a side view of the support body 70 before winding rotation.

As illustrated in (b) of FIG. 3, a portion that includes a part of the wiring line region 24 of the flexible display panel 20 and is beyond the flexible cable 40, that is, a portion positioned in a direction away from the flexible display panel 20, is folded on an upper layer of the circuit substrate 50 and is disposed on the planar portion 80 of the support body 70 in an overlapping manner.

In a state in which the flexible display panel 20 is drawn, the flexible display panel 20 is not present on the circuit substrate 50 and the like.

When Storing Flexible Display Panel

A case where the flexible display panel 20 is stored will be next described.

(c) of FIG. 3 is a side view of the support body 70 after starting winding rotation.

When the flexible display panel 20 is stored, the support body 70 is rotated (arrow in (c) of FIG. 3) to wind the flexible display panel 20 around the outer circumferential surface 72 of the support body 70. In a state in which the flexible display panel 20 is wound around the support body 70, the flexible display panel 20 is present on the circuit substrate 50 and the like.

Advantageous Effects

In Example 1, the circuit substrate 50 that is rigid and has a flat plate shape, and the like are disposed on one of the planar portions 80 that are flat, rather than on a curved surface. As a result, the circuit substrate 50 and the like can be stably fixed to the support body 70.

In addition, the circuit substrate 50 that has a flat plate shape, and the like are disposed on one of the planar portions 80 that are flat, so that unevenness is less likely to occur on the outer circumferential surface 72 of the support body 70. Due to this, the flexible display panel 20 is not wound on a large unevenness and thus it is possible to store the flexible display panel 20 while reducing damage of the flexible display panel 20. In addition, when a display element formed in the flexible display panel 20 is a display element of an organic light emitting diode (OLED), the flexible display panel 20 can be wound around the support body 70 while suppressing damage of the OLED element that is relatively fragile.

Furthermore, in Example 1, the rollable display apparatus 10 can be assembled by affixing the circuit substrate 50 to the outer circumferential surface 72 of the support body 70. In other words, a procedure for storing the circuit substrate 150 in the support body 170 via the slit 171 as in the known example is not required. Accordingly, in Example 1, it is possible to easily assemble the rollable display apparatus 10.

As described above, in Example 1, the support body 70 has a non-circular cross-sectional shape, specifically an elliptical cross-sectional shape, and has the planar portions 80 that are flat, so that it is possible to provide the rollable display apparatus 10 which can be easily assembled and in which it is less likely to damage the flexible display panel 20 and the like.

Note that the rollable display apparatus 10 may include a storing portion 12 covering entire rotating members such as the support body 70, as illustrated by a dotted line 12 in each of (b) of FIG. 3 and (c) of FIG. 3. The storing portion 12 may also be provided in each of the following Examples, but in view of making the drawings easy to view, the illustration thereof will be omitted.

Example 2

Overview of Rollable Display Apparatus

Hereinafter, with reference to FIG. 4, Example 2 of the disclosure will be described. Note that, in the following description, differences from Example 1 will be mainly described.

Figure 4:
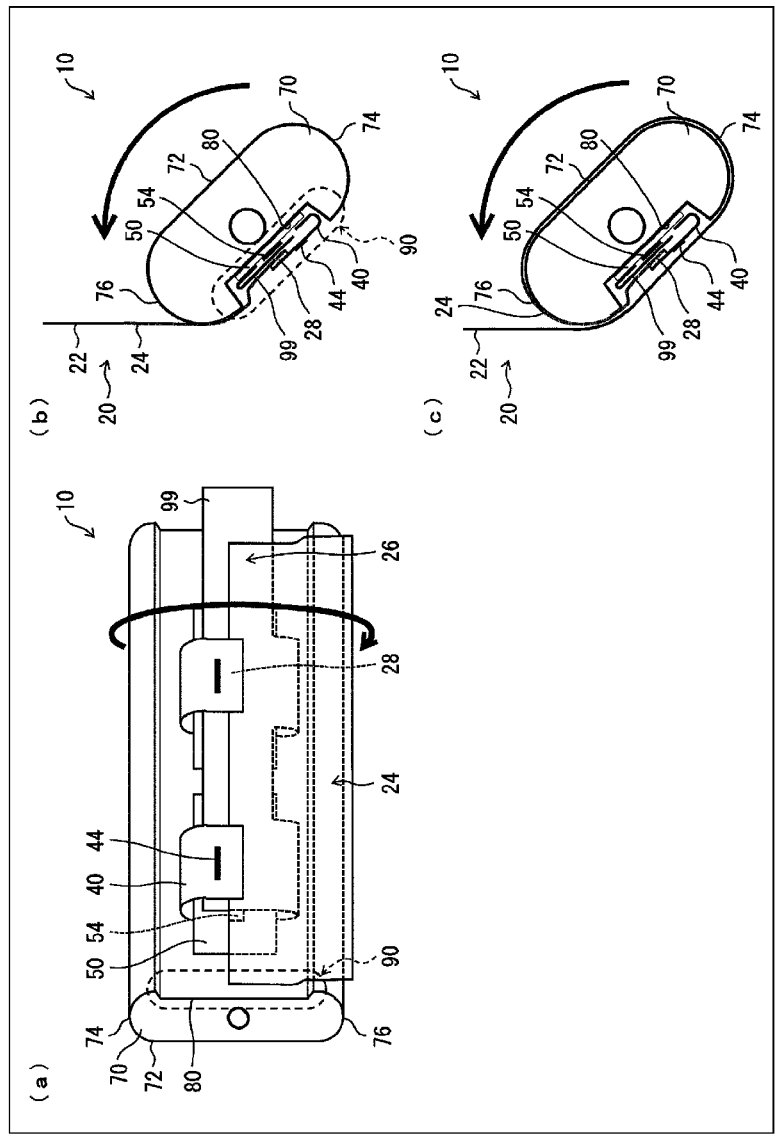
FIG. 4 includes views illustrating a rollable display apparatus of Example 2, where (a) illustrates a front view of a support body, (b) illustrates a side view of the support body before winding rotation, and (c) illustrates a side view of the support body after starting winding rotation.

FIG. 4 includes views illustrating a rollable display apparatus 10 of Example 2.

As illustrated in FIG. 4, a main difference between Example 2 and Example 1 is that a recessed portion 90 is formed in one of planar portions 80 of a support body 70. Hereinafter, the configuration will be described sequentially.

(a) of FIG. 4 is a front view of the support body 70. As illustrated in (a) of FIG. 4, in the support body 70 of Example 2, one of the planar portions 80 is disposed in a position recessed in an outer circumferential surface 72, thereby forming the recessed portion 90. A circuit substrate 50 is disposed on the planar portion 80 that forms a bottom surface of the recessed portion 90.

In other words, in Example 1, the circuit substrate 50 is disposed on one of the planar portions 80 that form a part of the elliptical cross-sectional shape of the support body 70. In contrast, in Example 2, the circuit substrate 50 is disposed on the planar portion 80 positioned downward in an internal direction of the support body 70 from the outer circumferential surface 72 of the support body 70.

In addition, with the circuit substrate 50 being disposed on the bottom surface of the recessed portion 90, a flexible cable 40 and an external connection cable 99 connected to the circuit substrate 50 are also disposed in the recessed portion 90.

When Drawing Flexible Display Panel

Next, a state in which the flexible display panel 20 is drawn will be described with reference to (b) of FIG. 4. (b) of FIG. 4 is a side view of the support body 70 before winding rotation. As illustrated in (b) of FIG. 4, a portion that includes a part of the wiring line region 24 of the flexible display panel 20 and is beyond the flexible cable 40, that is, a portion positioned in a direction away from the flexible display panel 20, is folded on an upper layer of the circuit substrate 50 and stored in the recessed portion 90 of the support body 70 in an overlapping manner.

In a state in which the flexible display panel 20 and the flexible cable 40 are drawn, the flexible display panel 20 does not cover the recessed portion 90, and the circuit substrate 50 and the like are exposed to the outside of the support body 70.

When Storing Flexible Display Panel

A case where the flexible display panel 20 is stored will be next described with reference to (c) of FIG. 4. (c) of FIG. 4 is a side view of the support body 70 after starting winding rotation. In storing the flexible display panel 20, the support body 70 is rotated (arrow in (c) of FIG. 4) to wind the flexible display panel 20 around the outer circumferential surface 72 of the support body 70.

In Example 2, because the circuit substrate 50 and the like are stored in the recessed portion 90, even when the support body 70 is rotated (arrow in (b) of FIG. 4), the flexible display panel 20 does not interfere with a portion beyond the flexible cable 40, such as the circuit substrate 50. That is, in a state of being wound around the support body 70, the flexible display panel 20 does not come into contact with the circuit substrate 50 that is rigid.

Summary

As described above, in Example 2, the recessed portion 90, which is a recessed portion including the planar portion 80 as a bottom surface thereof, is formed in the support body 70. The circuit substrate 50 and the like are stored in the recessed portion 90. As a result, it is possible to suppress damage of the flexible display panel 20 and application of unnecessary pressing to the surface of the flexible display panel 20 when winding the flexible display panel 20 around the support body 70.

Example 3

Overview of Rollable Display Apparatus

Hereinafter, with reference to FIG. 5 and the like, Example 3 of the disclosure will be described. Note that, in the following description, the differences from Examples described above will be mainly described.

Figure 5:
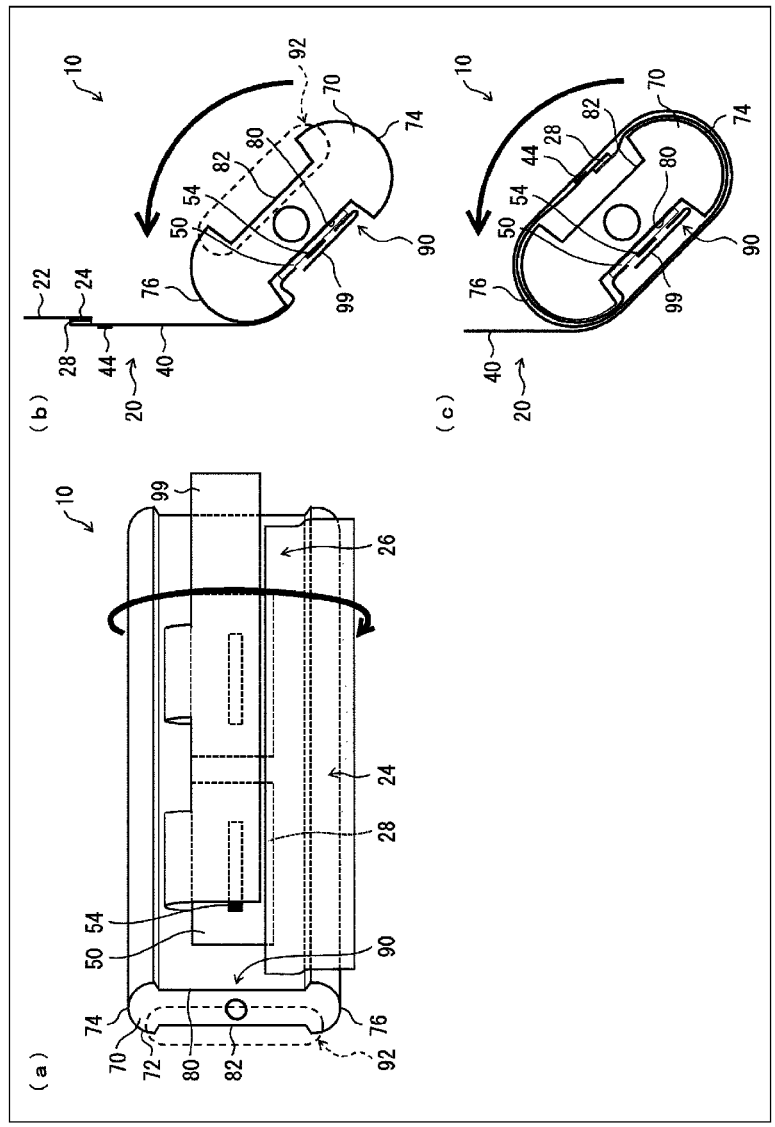
FIG. 5 includes views illustrating a rollable display apparatus of Example 3, where (a) illustrates a front view of a support body, (b) illustrates a side view of the support body before winding rotation, and (c) illustrates a side view of the support body after starting winding rotation.

FIG. 5 includes views illustrating a rollable display apparatus 10 of Example 3.

As illustrated in FIG. 5, a main difference between Example 3 and Example 2 is that two recessed portions 90, 92 are formed in a support body 70. Hereinafter, the configuration will be described sequentially.

(a) of FIG. 5 is a front view of the support body 70. As illustrated in (a) of FIG. 5, in the support body 70 of Example 3, the other recessed portion 92 is formed in a position facing the recessed portion 90. A bottom surface of the recessed portion 92 is constituted by another planar portion 82 at a position opposite to a planar portion 80.

In other words, in Example 2, one recessed portion and one planar portion are formed, whereas in Example 3, two recessed portions and two planar portions are formed at opposing positions in the elliptical shape of the support body 70.

According to this configuration, in Example 3, in addition to a circuit substrate 50, a driver circuit 44 provided on a flexible cable 40 can also be stored in the recessed portion 92. Hereinafter, this point will be described.

When Drawing Flexible Display Panel (b) of FIG. 5 is a side view of the support body 70 before winding rotation. A state in which the flexible display panel 20 is drawn will be described with reference to (b) of FIG. 5. In the state in which the flexible display panel 20 is drawn, the circuit substrate 50 and the like are stored in the recessed portion 90, whereas nothing is stored in the other recessed portion 92.

When Storing Flexible Display Panel

Next, a case where the flexible display panel 20 is stored will be described with reference to (c) of FIG. 5. (c) of FIG. 5 is a side view of the support body 70 after starting winding rotation.

When the support body 70 is rotated (arrow in (c) of FIG. 5) to store the flexible display panel 20, the driver circuit 44 provided in the flexible cable 40 is positioned in the other recessed portion 92.

Thus, in Example 3, in addition to the circuit substrate 50 and the like being stored in the recessed portion 90, the driver circuit 44 is also stored in the other recessed portion 92. Due to this, even when the support body 70 is rotated (arrow in (b) of FIG. 5) to wind the flexible display panel 20 so that the flexible display panel 20 comes into contact with the driver circuit 44, stress on the flexible display panel 20 by the driver circuit 44 is alleviated. This is because the other recessed portion 92 is formed in the lower portion of the driver circuit 44 so that the driver circuit 44 pushed by the flexible display panel 20 can enter the other recessed portion 92.

Summary

As described above, in Example 3, it is possible to suppress application of unnecessary pressing against the surface of the flexible display panel 20 from elements such as the driver circuit 44 formed on the flexible cable 40, in addition to the circuit substrate 50 and the like.

Additionally, in Example 3, the driver circuit 44 can be stored in the other recessed portion 92 formed at a position different from the recessed portion 90 in which the circuit substrate 50 is stored. Thus, it is not necessary to dispose the driver circuit 44 so as to be stored in the recessed portion 90 in which the circuit substrate 50 is stored, so that the degree of freedom of the arrangement of the driver circuit 44 is increased. Accordingly, a wiring line region 24 of the flexible display panel 20 can be reduced, and a display region 122 can be increased. Furthermore, the degree of freedom of wiring lines is increased so that routing with low wiring resistance becomes possible.

Modification of Example 3

Note that, in the above description, the driver circuit 44 is illustrated as a member stored in the other recessed portion 92. However, the member stored in the recessed portion 92 is not limited to the driver circuit 44. For example, in the rollable display apparatus 110 in which the circuit substrates are provided in two stages as illustrated in FIG. 1, another circuit substrate separate from the circuit substrate 50 can be stored in the other recessed portion 92.

Example 4

Overview of Rollable Display Apparatus

Next, with reference to FIG. 6 and the like, Example 4 of the disclosure will be described. Note that, in the following description, the differences from Examples described above will be mainly described.

Figure 6:
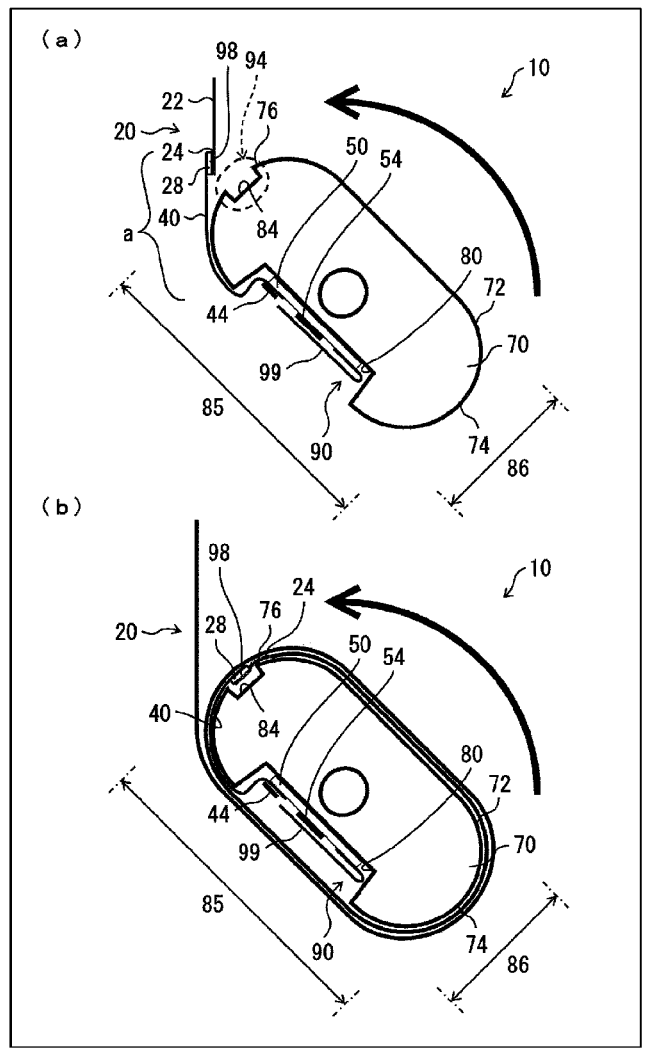
FIG. 6 includes views illustrating a rollable display apparatus of Example 4, where (a) illustrates a side view of a support body before winding rotation, and (b) illustrates a side view of the support body after starting winding rotation.

FIG. 6 includes views illustrating a rollable display apparatus 10 of Example 4.

As illustrated in FIG. 6, a main difference between Example 4 and Example 2 is that two recessed portions 90, 94 are formed in a support body 70. Hereinafter, the configuration will be described sequentially.

(a) of FIG. 6 is a side view of the support body 70 before winding rotation. As illustrated in (a) of FIG. 6, the support body 70 of Example 4 has the additional recessed portion 94 formed in a curved portion 76, which is separate from the recessed portion 90. Furthermore, a bottom surface of the recessed portion 94 is constituted by an additional planar portion 84 that is a plane in a direction substantially orthogonal to a planar portion 80.

In other words, in Example 2, one recessed portion and one planar portion are formed on a long side 85 in the elliptical shape of the support body 70, while in Example 4, one recessed portion and one planar portion are formed on each of the long side 85 and a short side 86 in the elliptical shape of the support body 70, that is, two recessed portions and two planar portions in total. The additional recessed portion 94 formed on the short side 86 in the elliptical shape is smaller in size than the recessed portion 90 formed on the long side 85 in the elliptical shape.

With this configuration, in Example 4, in addition to a circuit substrate 50, an anisotropic conductive film (ACF) connection portion 98, which is a connection portion between a wiring line region 24 of a flexible display panel 20 and a flexible cable 40, can be stored in the recessed portion 94. Hereinafter, this point will be described.

When Drawing Flexible Display Panel

As illustrated in (a) of FIG. 6 above, in a state in which the flexible display panel 20 is drawn, the circuit substrate 50 and the like are stored in the recessed portion 90, whereas nothing is stored in the additional recessed portion 94.

When Storing Flexible Display Panel

Next, with reference to (b) of FIG. 6, a case where the flexible display panel 20 is stored will be described. (b) of FIG. 6 is a side view of the support body 70 after starting winding rotation.

When the support body 70 is rotated (arrow in (b) of FIG. 6) to store the flexible display panel 20, the ACF connection portion 98 is positioned in the additional recessed portion 94.

Thus, in Example 4, in addition to the circuit substrate 50 and the like being stored in the recessed portion 90, the ACF connection portion 98 is also stored in the additional recessed portion 94. Due to this, even when the support body 70 is rotated (arrow in (b) of FIG. 6) so that the flexible display panel 20 comes into contact with the ACF connection portion 98, stress on the flexible display panel 20 by the ACF connection portion 98 is alleviated. This is because the additional recessed portion 94 is formed below the ACF connection portion 98 so that the ACF connection portion 98 pushed by the flexible display panel 20 can enter the additional recessed portion 94.

Summary

As described above, in Example 4, it is possible to suppress application of unnecessary pressing against the surface of the flexible display panel 20 from connection portions such as the ACF connection portion 98 between the wiring line region 24 of the flexible display panel 20 and the flexible cable 40, in addition to the circuit substrate 50 and the like.

Note that an area and a step of the ACF connection portion 98 are smaller than those of the circuit substrate 50 and thus the additional recessed portion 94 can be made smaller than the recessed portion 90.

Furthermore, in Example 4, the ACF connection portion 98 can be stored in the additional recessed portion 94 formed at a position proximate to the recessed portion 90 in which the circuit substrate 50 is stored. Thus, a distance between the ACF connection portion 98 and the circuit substrate 50 can be shortened, so that a distance from the flexible display panel 20 to the circuit substrate 50 can be made smaller. Accordingly, it is possible to reduce wiring resistance and minimize the rollable display apparatus 10.

Example 5

Overview of Rollable Display Apparatus

Figure 7:
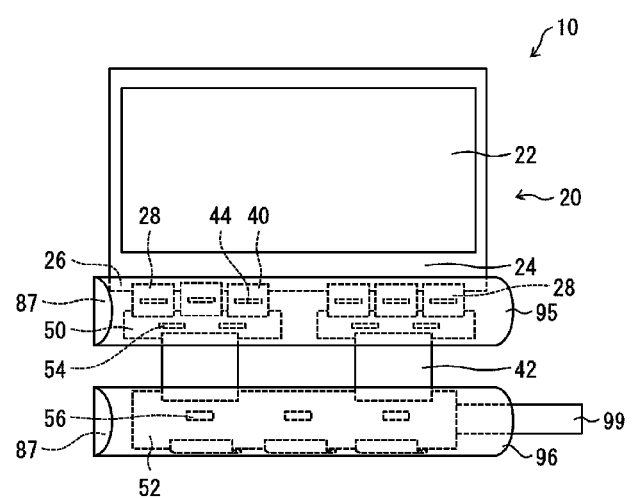
FIG. 7 is a view illustrating an entirety of a rollable display apparatus according to Example 5.

Hereinafter, with reference to FIGS. 7 and 8, Example 5 of the disclosure will be described. Note that, in the following description, the differences from Examples described above will be mainly described.

Figure 8:
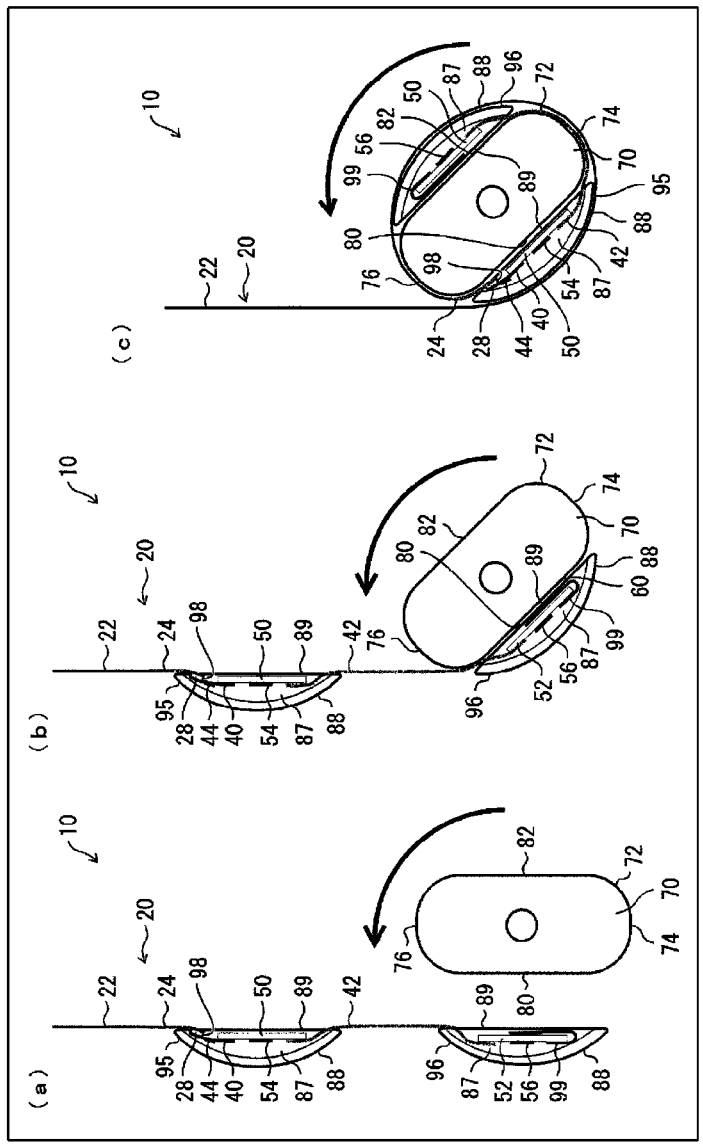
FIG. 8 includes views illustrating the rollable display apparatus of Example 5, where (a) illustrates a support body and the like before mounting, (b) illustrates a side view of the support body before winding rotation, and (c) illustrates a side view of the support body after starting winding rotation.

FIG. 8 includes views illustrating a rollable display apparatus 10 of Example 5.

As illustrated in FIG. 8, a main difference between Example 5 and Example 2 is that in addition to the support body 70, two covers 95, 96 each having a semicircular shape are provided. Two circuit substrates 50, 52 are stored in interiors 87 of the covers 95, 96, rather than the support body 70. Hereinafter, the configuration will be described sequentially.

First, an overview of the rollable display apparatus 10 of Example 5 will be described with reference to FIG. 7. FIG. 7 is a view illustrating an entirety of the rollable display apparatus 10 of Example 5. The rollable display apparatus 10 of Example 5 includes the circuit substrates 50, 52 disposed in two stages, similarly to the rollable display apparatus 110 illustrated in (b) of FIG. 1. The circuit substrates 50, 52 are stored in the covers 95, 96 each having a semicircular shape, respectively, and covered by the covers 95, 96. With reference to FIG. 8, more detailed description will be given.

Before Mounting (a) of FIG. 8 is a view illustrating the rollable display apparatus 10 before mounting the covers 95, 96 on the support body 70. As illustrated in (a) of FIG. 8, in the rollable display apparatus 10 of Example 5, the circuit substrate 50 and the other circuit substrate 52 are sequentially connected from a wiring line region 24 of a flexible display panel 20 to an external connection cable 99, and the circuit substrate 50 and the other circuit substrate 52 are covered by the cover 95 and the other cover 96, respectively.

More specifically, the circuit substrate 50 on which a drive circuit 54 is provided is connected to the wiring line region 24 of the flexible display panel 20 via a flexible cable 40. Then, the wiring line region 24 and the flexible cable 40 are connected via an ACF connection portion 98 at a terminal portion 28. In addition, the flexible cable 40 is provided with a driver circuit 44. Meanwhile, the circuit substrate 50 and the other circuit substrate 52 are connected by a flexible cable 42 for relay.

Here, the circuit substrate 50 including the drive circuit 54, the flexible cable 40 including the driver circuit 44, the ACF connection portion 98, and a part of the flexible cable 42 for relay are stored in the interior 87 of the cover 95. Then, a chordal portion 89 of the cover 95 having a semi-circular shape is substantially flat.

Furthermore, another drive circuit 56 is provided on the other circuit substrate 52, and the circuit substrate 52 is connected to the external connection cable 99.

Here, the circuit substrate 52 including the drive circuit 56, a part of the flexible cable 42 for relay, and the external connection cable 99 are stored in the interior 87 of the other cover 96. Then, the chordal portion 89 of the cover 96 having a semi-circular shape is substantially flat.

After Mounting

When Drawing Flexible Display Panel

Next, the rollable display apparatus 10 after mounting will be described with reference to (b) of FIG. 8. (b) of FIG. 8 is a side view of the support body 70 before winding rotation.

As illustrated in (b) of FIG. 8, the cover 96 that stores the circuit substrate 52 is mounted on the support body 70. Specifically, the cover 96 is attached to the support body 70 such that the chordal portion 89 of the cover 96 and a planar portion 80 of the support body 70 face each other.

When Storing Flexible Display Panel

Next, a case where the flexible display panel 20 is stored will be described with reference to (b) of FIG. 8. (b) of FIG. 8 is a side view of the support body 70 after starting winding rotation.

When the support body 70 is rotated (arrow in (b) of FIG. 8) to store the flexible display panel 20, the cover 95 is positioned on another planar portion 82 of the support body 70. Specifically, the cover 96 is provided on the support body 70 such that the chordal portion 89 of the cover 95 and the planar portion 82 of the support body 70 face each other.

As a result, the cover 95, the other cover 96, and the support body 70 form a tubular body having a substantially circular cross-sectional shape. Specifically, the two curved portions 74, 76 of the support body 70 and an outer circumferential surface 88 of each of the covers 95, 96 form a substantially circular shape.

Then, when the support body 70 is further rotated, the flexible display panel 20 is wound around the outer circumferential surface 72 of the support body 70, in particular, the two curved portions 74, 76, and the outer circumferential surface 88 of each of the covers 95, 96.

Summary

As described above, in Example 5, the circuit substrate 50, the drive circuit 54, the connection portion between the terminal portion 28 of the flexible display panel 20 and the flexible cable 40, and the like, which have a lower flatness than that of the flexible display panel 20, are covered by a cover that is a part of the tubular body around which the flexible display panel 20 is wound. Furthermore, in a state in which the flexible display panel 20 is wound, the covers 95, 96 and the support body 70 are substantially circular in cross-sectional shape.

As a result, the flexible display panel 20 can be smoothly wound while suppressing damage to the flexible display panel 20.

In addition, the circuit substrates 50, 52, and the like which are rigid members are stored so as to correspond to the planar portions 82, 84 of the support body 70 in a state in which the flexible display panel 20 is wound. Accordingly, application of unnecessary external pressure to the circuit substrates 50, 52 and the like can be suppressed.

Example 6

Overview of Rollable Display Apparatus

Hereinafter, with reference to FIG. 9, Example 6 of the disclosure will be described. Note that, in the following description, the differences from Examples described above will be mainly described.

Figure 9:
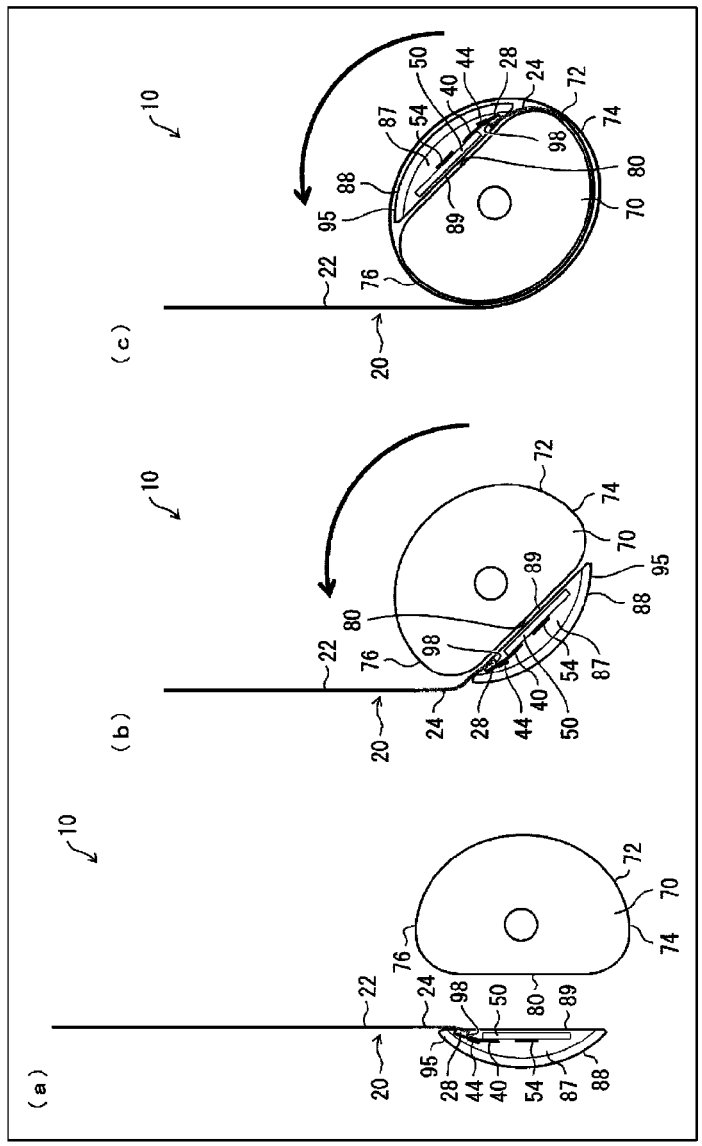
FIG. 9 includes views illustrating a rollable display apparatus of Example 6, where (a) illustrates a support body and the like before mounting, (b) illustrates a side view of the support body before winding rotation, and (c) illustrates a side view of the support body after starting winding rotation.

FIG. 9 includes views illustrating a rollable display apparatus 10 of Example 6.

As illustrated in FIG. 9, a main difference between Example 6 and Example 5 is that there is one circuit substrate and along with this, there is one cover. Hereinafter, this point will be described.

Before Mounting (a) of FIG. 9 is a view illustrating the rollable display apparatus 10 before mounting a cover 95 on a support body 70. As illustrated in (a) of FIG. 9, one circuit substrate 50 is connected from a wiring line region 24 of a flexible display panel 20 to an external connection cable 99, and the cover 95 covers the circuit substrate 50.

More specifically, an interior 87 of the cover 95 stores the circuit substrate 50 including a drive circuit 54, a flexible cable 40 including a driver circuit 44, an ACF connection portion 98, and the external connection cable 99. Then, a chordal portion 89 of the cover 95 having a semi-circular shape is substantially flat.

After Mounting

When Drawing Flexible Display Panel

Next, the rollable display apparatus 10 after mounting will be described with reference to (b) of FIG. 9. (b) of FIG. 9 is a side view of the support body 70 before winding rotation.

As illustrated in (b) of FIG. 9, the cover 95 storing the circuit substrate 50 is mounted on the support body 70. Specifically, the cover 95 is combined with the support body 70 such that the chordal portion 89 of the cover 95 and a planar portion 80 of the support body 70 face each other.

Note that in Example 6, only one planar portion is formed on the support body 70. Then, when the one planar portion is combined with one cover, a tubular body having a substantially circular cross-sectional shape is formed. This is because unlike Example 5, there is one cover that is combined with support body 70.

Thus, with the cover 95 attached to the support body 70, the cover 95 and the support body 70 form a tubular body having a substantially circular cross-sectional shape. Specifically, an outer circumferential surface 72 of the support body 70 including two curved portions 74, 76 of the support body 70 and an outer circumferential surface 88 of the cover 95 form a substantially circular shape.

When Storing Flexible Display Panel

Next, with reference to (c) of FIG. 9, a case where the flexible display panel 20 is stored will be described. (c) of FIG. 9 is a side view of the support body 70 after starting winding rotation.

When the support body 70 is rotated (arrow in (c) of FIG. 9) to store the flexible display panel 20, the flexible display panel 20 is wound along the outer circumferential surface 72 including the two curved portions 74, 76 of the support body 70 and the outer circumferential surface 88 of the cover 95.

Summary

As described above, in Example 6, the flexible display panel 20 is wound around a tubular body having a substantially circular cross-sectional shape constituted by the support body 70 and the cover 95.

As a result, the flexible display panel 20 can be smoothly wound while suppressing damage to the flexible display panel 20.

Example 7

Overview of Rollable Display Apparatus

Hereinafter, with reference to FIG. 10, Example 7 of the disclosure will be described. (a) of FIG. 10 is a view of a support body and the like of a rollable display apparatus 10 of Example 7 before mounting, (b) of FIG. 10 is a side view of the support body and the like before winding rotation, and (c) of FIG. 10 is a side view of the support body and the like after starting winding rotation.

Note that, in the following description, the differences from Examples described above will be mainly described. As illustrated in FIG. 10, a main difference between Example 7 and Example 5 is that recesses and protrusions are formed on covers 95, 96 and a support body 70 in corresponding positions so as to fit each other. Hereinafter, this point will be described.

Before Mounting

Figure 10:
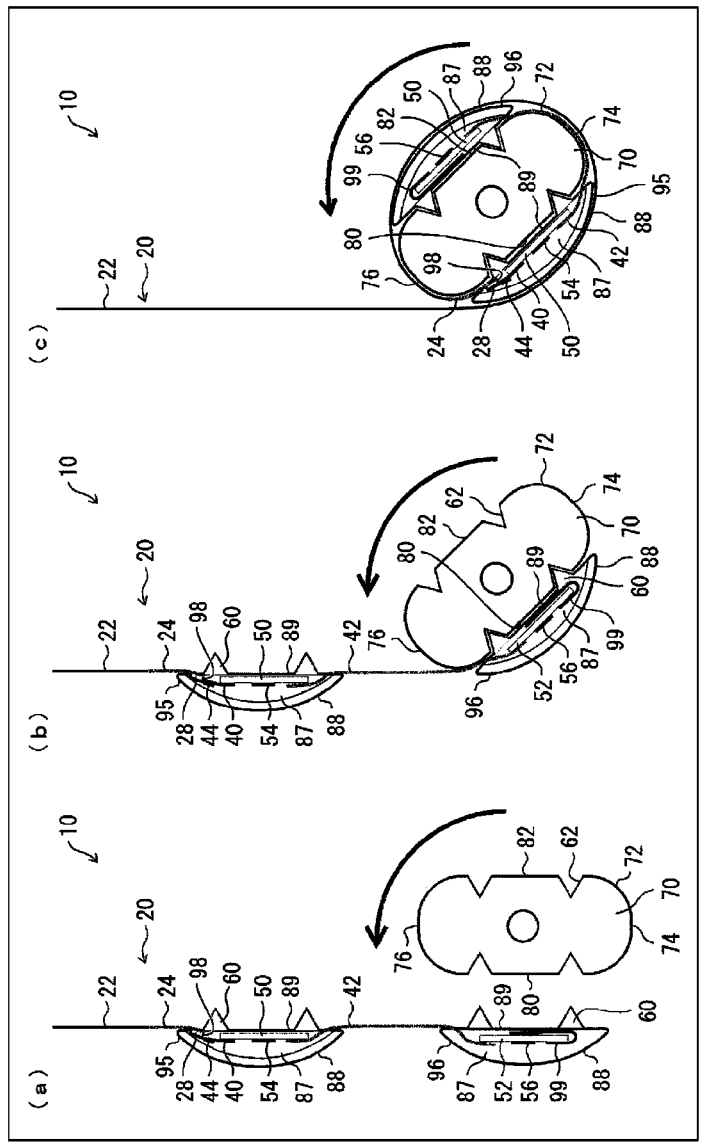
FIG. 10 includes views illustrating a rollable display apparatus of Example 7, where (a) illustrates a support body and the like before mounting, (b) illustrates a side view of the support body before winding rotation, and (c) illustrates a side view of the support body after starting winding rotation.

As illustrated in (a) of FIG. 10, recesses 62 are formed in each of two planar portions 80, 82 of the support body 70 of Example 7. On the other hand, each of the covers 95, 96 is provided with projections 60 each having a form to fit each of the recesses 62 in a chordal portion 89 of each of the covers 95, 96.

After Mounting

When Drawing Flexible Display Panel

With the flexible display panel drawn, only the cover 96 of the two covers 95, 96 is mounted on the support body 70, as illustrated in (b) of FIG. 10. When the cover 96 is mounted on the support body 70, the recesses 62 formed in the planar portion 80 of the support body 70 and the projections 60 formed in the chordal portion 89 of the cover 96 are fitted together. Thus, the cover 96 is disposed at a desired position of the support body 70 without misaligning the cover 96 and the support body 70.

In addition, two projections 60 and two recesses 62 are provided in the chordal portion 89 of the cover 96 and the planar portion 80 of the support body 70, respectively. Thus, the cover 96 and the support body 70 are in a desired state, as to in a disposed direction, as well as the disposed positions.

Note that the number of the projections 60 and the recesses 62 is not limited to two. In addition, although the projections 60 and the recesses 62 each having a triangular cross-sectional shape are illustrated in Example 7, the shape is not limited to the triangular shape.

When Storing Flexible Display Panel

Next, a case where the flexible display panel 20 is stored will be described with reference to (c) of FIG. 10.

When the support body 70 is rotated (arrow in (b) of FIG. 10) to store the flexible display panel 20, the cover 95 comes into contact with the support body 70 and the covers 95, 96 and the support body 70 are integrated. At this time, two projections 60 are provided in the chordal portion 89 of the cover 96, while two recesses 62 are provided in the planar portion 82 of the support body 70. Then, the projections 60 and the recesses 62 are disposed so that the cover 96 and the support body 70 are in a predetermined positional relationship when the projections 60 and the recesses 62 are fitted together.

Accordingly, when the support body 70 is rotated and the cover 95 comes into contact with the support body 70, the cover 96 is disposed at a predetermined position on the support body 70 without misalignment.

Summary

As described above, in Example 7, the recesses 62 are provided in the planar portions 80, 82 for alignment, and the projections 60 are provided on the covers 95, 96 so as to correspond to the recesses 62. As a result, the covers 95, 96 and the support body 70 are easily and reliably disposed in a predetermined positional relationship, so that off-center winding of the flexible display panel 20 is less likely to occur. Then, even if the flexible display panel 20 is repeatedly unwound and wound, it is possible to dispose the covers 95, 96 at the same positions on the support body 70, thereby allowing for stable unwinding and winding of the flexible display panel 20.

Modification of Example 7

Note that in the above description, a configuration in which the covers 95, 96 are provided with the projections 60 and the support body 70 is provided with the recesses 62 has been illustrated. However, Example 7 is not limited to this configuration. For example, in contrast to the above description, a configuration in which the covers 95, 96 are provided with the recesses 62, while the support body 70 is provided with the projections 60 may be adopted.

Furthermore, in the above description, a configuration in which the covers 95, 96 are provided with the projections 60 or the recesses 62 has been illustrated. However, the projections 60 or the recesses 62 may be provided on the circuit substrates 50, 52 or the like, rather than on the covers 95, 96.

Example 8

Overview of Rollable Display Apparatus

Hereinafter, with reference to FIG. 11, Example 8 of the disclosure will be described. (a) of FIG. 11 is a view of a support body and the like of a rollable display apparatus 10 of Example 8 before mounting, (b) of FIG. 11 is a side view of the support body and the like before winding rotation, and (c) of FIG. 11 is a side view of the support body and the like after starting winding rotation.

Note that, in the following description, the differences from Examples described above will be mainly described. As illustrated in FIG. 11, a main difference between Example 8 and Example 7 is an approach for aligning covers 95, 96 with a support body 70. That is, in Example 7, the projections 60 and the recesses 62 are used for alignment. In contrast, in Example 8, magnets are used for alignment. Hereinafter, this point will be described.

Figure 11:
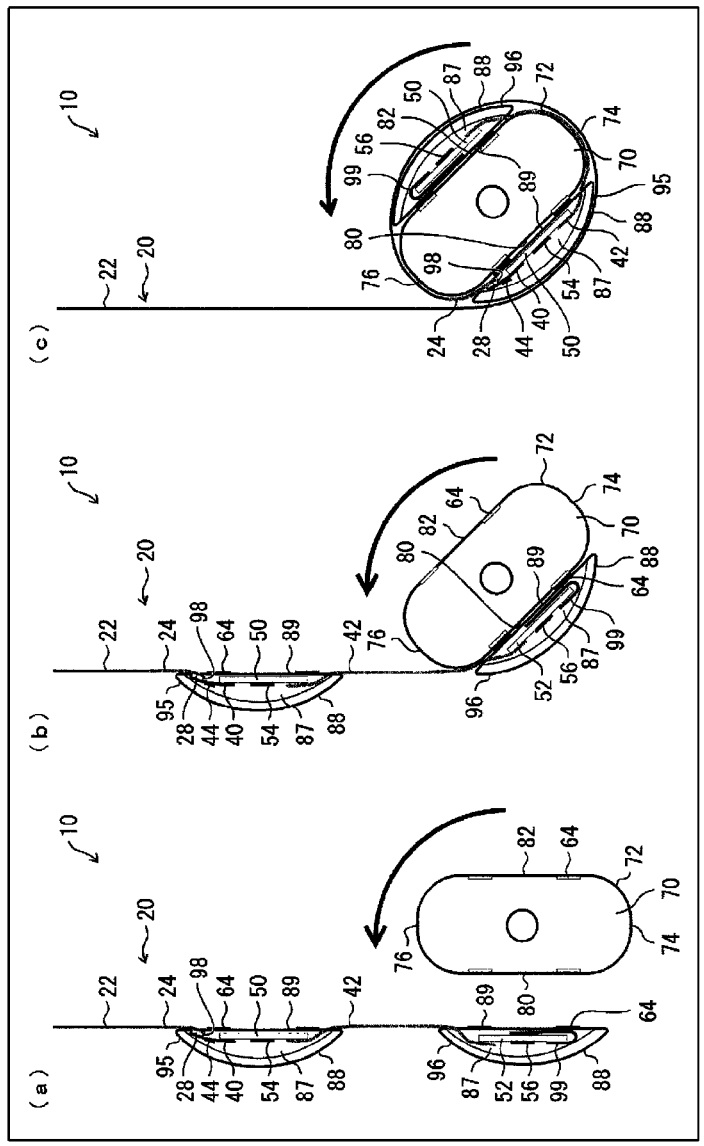
FIG. 11 includes views illustrating a rollable display apparatus of Example 8, where (a) illustrates a support body and the like before mounting, (b) illustrates a side view of the support body before winding rotation, and (c) illustrates a side view of the support body after starting winding rotation.

As illustrated in (a) of FIG. 11 and the like, two magnets 64 are provided on a chordal portion 89 of the cover 96, and two magnets 64 are provided in a planar portion 80 of the support body 70 at positions corresponding to the two magnets 64 of the cover 96.

In addition, two magnets 64 are also provided on the chordal portion 89 of the cover 95, and two magnets 64 are provided in the planar portion 82 of the support body 70 at positions corresponding to the two magnets 64 of the cover 95.

As a result, similarly to Example 7, the covers 95, 96 and the support body 70 are disposed in an appropriate positional relationship.

Accordingly, in Example 8, as in Example 7, off-center winding of the flexible display panel 20 or the like is less likely to occur. Then, even if the flexible display panel 20 is repeatedly unwound and wound, it is possible to stably unwind and wind the flexible display panel 20.

Note that all the opposing magnets 64 may be magnets 64, or the magnets 64 of the covers or the magnets 64 of the support body may be replaced with metal or the like.

In addition, the magnets of the cover 96 that is first combined with the support body 70 can be stronger magnets than the magnets of the cover 95 that is subsequently combined with the support body 70. As a result, when the flexible display panel 20 is unwound and wound, the flexible display panel 20 and the support body 70 can be made difficult to uncouple.

Furthermore, because the cover 96 and the support body 70 are coupled by a magnetic force, the cover 96 and the support body 70 can be easily detached from and attached to each other during repair or the like.

Note that the display apparatus according to the embodiments described above may include a display element in which luminance and transmittance are controlled by current, or a display element in which luminance and transmittance are controlled by voltage.

For example, the display apparatus according to each of the embodiments described above may include an organic light emitting diode (OLED) as a display element for current control. In this case, the display apparatus according to the present embodiment is an organic electro luminescence (EL) display.

Alternatively, the display apparatus according to each embodiment may include an inorganic light emitting diode as a display element for current control. In this case, the display apparatus according to the present embodiment is an EL display such as an inorganic EL display, and is a quantum dot light emitting diode (QLED) display in a case of including a QLED.

Furthermore, examples of the display element for voltage control include a liquid crystal display element.

Supplement

A rollable electronic apparatus according to a first aspect of the disclosure is a rollable electronic apparatus being windable, the rollable electronic apparatus including:
a flexible electronic device; a flexible cable; a circuit substrate; and a support body having a tubular shape, in which
the flexible electronic device includes a terminal portion,
the flexible cable connects the terminal portion and the circuit substrate,
a drive circuit is mounted on the circuit substrate,
the flexible electronic device and the flexible cable are wound on an outer circumferential surface of the support body by rotating the support body,
the support body has, in a cross-sectional view, two curved portions and a planar portion connecting the two curved portions, and
the circuit substrate is stored in the planar portion in a state in which the flexible cable is wound.

In a rollable electronic apparatus according to a second aspect of the disclosure,
a recessed portion having the planar portion as a bottom surface is formed between the two curved portions, and
the circuit substrate is stored in the recessed portion in a state in which the flexible cable is wound.

In a rollable electronic apparatus according to a third aspect of the disclosure,
  a recessed portion having the planar portion as a bottom surface is formed between the two curved portions, and
  the circuit substrate is fixed to the bottom surface exposed from the support body in a state in which the flexible electronic device and the flexible cable are drawn.

In a rollable electronic apparatus according to a fourth aspect of the disclosure,
  the support body has another planar portion at a position opposite to the planar portion, and
  another recessed portion having the other planar portion as a bottom surface is formed in the support body.

In a rollable electronic apparatus according to a fifth aspect of the disclosure,
  a driver circuit is mounted on the flexible cable, and
  the driver circuit is stored in the other recessed portion in a state in which the flexible cable is wound.

In a rollable electronic apparatus according to a sixth aspect of the disclosure,
  another circuit substrate provided with another drive circuit is provided between the flexible electronic device and the circuit substrate, and
  the other circuit substrate is stored in the other recessed portion in a state in which the flexible cable is wound.

In a rollable electronic apparatus according to a seventh aspect of the disclosure,
  the support body has a long side and a short side in a cross-sectional view,
  the planar portion is positioned on the long side,
  the support body has an additional planar portion on the short side,
  an additional recessed portion having the additional planar portion as a bottom surface is formed in the support body, and
  the additional recessed portion is smaller than a recessed portion having the planar portion positioned on the long side as a bottom surface.

In a rollable electronic apparatus according to an eighth aspect of the disclosure,
  a driver circuit is mounted on the flexible cable, and
  the driver circuit is stored in the additional recessed portion in a state in which the flexible cable is wound.

In a rollable electronic apparatus according to a ninth aspect of the disclosure,
  the flexible electronic device and the flexible cable are connected via an ACF connection portion, and
  the ACF connection portion is stored in the additional recessed portion in a state in which the flexible cable is wound.

In a rollable electronic apparatus according to a tenth aspect of the disclosure,
  the circuit substrate is contained in a cover having a semi-circular shape, and
  the circuit substrate is stored corresponding to the planar portion in a state in which the flexible cable is wound.

In a rollable electronic apparatus according to an eleventh aspect of the disclosure,
  another circuit substrate is provided between the flexible electronic device and the circuit substrate,
  the other circuit substrate is contained in another cover having a semi-circular shape,
  the support body has another planar portion at a position opposite to the planar portion, and
  the other circuit substrate is stored corresponding to the other planar portion in a state in which the flexible cable is wound.

In a rollable electronic apparatus according to a twelfth aspect of the disclosure,
  a recess is provided in the planar portion,
  at least one of the cover and the circuit substrate is provided with a projection for alignment, and
  the recess corresponds to the projection.

In a rollable electronic apparatus according to a thirteenth aspect of the disclosure,
  a projection is provided on the planar portion,
  at least one of the cover and the circuit substrate is provided with a recess for alignment, and
  the projection corresponds to the recess.

In a rollable electronic apparatus according to a fourteenth aspect of the disclosure,
  at least one of the cover and the support body is provided with a magnet for alignment.

In a rollable electronic apparatus according to a fifteenth aspect of the disclosure,
  the flexible electronic device is wound around outer circumferences of the support body and the cover.

In a rollable electronic apparatus according to a sixteenth aspect of the disclosure,
  in a cross-sectional view, the two curved portions of the support body and the cover form a circle.

In a rollable electronic apparatus according to a seventeenth aspect of the disclosure,
  the curved portion is at least a part of an elliptical shape.

A rollable display apparatus according to an eighteenth aspect of the disclosure is a rollable electronic apparatus described in any one of the first to seventeenth aspects of the disclosure, in which
  the flexible electronic device is a flexible display panel, and
  the flexible display panel includes a display region, a frame region, and the terminal portion provided at an end of the frame region.

The disclosure is not limited to each of the embodiments described above, various modifications may be made within the scope of the claims, and embodiments obtained by appropriately combining technical approaches disclosed in each of different embodiments also fall within the technical scope of the disclosure. Furthermore, novel technical features can be formed by combining the technical approaches disclosed in the embodiments.

The invention claimed is:

1. A rollable electronic apparatus being windable, comprising:
  a flexible electronic device; a flexible cable; a circuit substrate; and a support body having a tubular body,
  wherein the flexible electronic device includes a terminal portion,
  the flexible cable connects the terminal portion and the circuit substrate,
  a drive circuit is mounted on the circuit substrate,
  the flexible electronic device and the flexible cable are wound on an outer circumferential surface of the support body by rotating the support body,
  the support body has, in a cross-sectional view, two curved portions and a planar portion connecting the two curved portions, and
  the circuit substrate is stored in the planar portion in a state in which the flexible cable is wound.

2. The rollable electronic apparatus according to claim 1, wherein a recessed portion having the planar portion as a bottom surface is formed between the two curved portions, and the circuit substrate is stored in the recessed portion in a state in which the flexible cable is wound.

3. The rollable electronic apparatus according to claim 1, wherein a recessed portion having the planar portion as a bottom surface is formed between the two curved portions, and
the circuit substrate is fixed to the bottom surface exposed from the support body in a state in which the flexible electronic device and the flexible cable are drawn.

4. The rollable electronic apparatus according to claim 3, wherein the support body has another planar portion at a position opposite to the planar portion, and
another recessed portion having the other planar portion as a bottom surface is formed in the support body.

5. The rollable electronic apparatus according to claim 4, wherein a driver circuit is mounted on the flexible cable, and
the driver circuit is stored in the other recessed portion in a state in which the flexible cable is wound.

6. The rollable electronic apparatus according to claim 4, wherein another circuit substrate provided with another drive circuit is provided between the flexible electronic device and the circuit substrate, and
the other circuit substrate is stored in the other recessed portion in a state in which the flexible cable is wound.

7. The rollable electronic apparatus according to claim 3, wherein the support body has a long side and a short side in a cross-sectional view,
the planar portion is positioned on the long side,
the support body has an additional planar portion on the short side,
an additional recessed portion having the additional planar portion as a bottom surface is formed in the support body, and
the additional recessed portion is smaller than a recessed portion having the planar portion positioned on the long side as a bottom surface.

8. The rollable electronic apparatus according to claim 7, wherein a driver circuit is mounted on the flexible cable, and
the driver circuit is stored in the additional recessed portion in a state in which the flexible cable is wound.

9. The rollable electronic apparatus according to claim 7, wherein the flexible electronic device and the flexible cable are connected via an ACF connection portion, and
the ACF connection portion is stored in the additional recessed portion in a state in which the flexible cable is wound.

10. The rollable electronic apparatus according to claim 1, wherein the circuit substrate is contained in a cover having a semi-circular shape, and
the circuit substrate is stored corresponding to the planar portion in a state in which the flexible cable is wound.

11. The rollable electronic apparatus according to claim 10, wherein another circuit substrate is provided between the flexible electronic device and the circuit substrate,
the other circuit substrate is contained in another cover having a semi-circular shape,
the support body has another planar portion at a position opposite to the planar portion, and
the other circuit substrate is stored corresponding to the other planar portion in a state in which the flexible cable is wound.

12. The rollable electronic apparatus according to claim 10, wherein a recess is provided in the planar portion,
at least one of the cover and the circuit substrate is provided with a projection for alignment; and
the recess corresponds to the projection.

13. The rollable electronic apparatus according to claim 10, wherein a projection is provided on the planar portion,
at least one of the cover and the circuit substrate is provided with a recess for alignment, and
the projection corresponds to the recess.

14. The rollable electronic apparatus according to claim 10, wherein at least one of the cover and the support body is provided with a magnet for alignment.

15. The rollable electronic apparatus according to claim 10, wherein the flexible electronic device is wound around outer circumferences of the support body and the cover.

16. The rollable electronic apparatus according to claim 10, wherein in a cross-sectional view, the two curved portions of the support body and the cover form a circle.

17. The rollable electronic apparatus according to claim 1, wherein the curved portion is at least a part of an elliptical shape.

18. A rollable display apparatus being the rollable electronic apparatus described in claim 1,
wherein the flexible electronic device is a flexible display panel, and
the flexible display panel includes a display region, a frame region, and the terminal portion provided at an end of the frame region.

* * * * *